(12) United States Patent
Volkovich et al.

(10) Patent No.: US 10,340,196 B1
(45) Date of Patent: Jul. 2, 2019

(54) METHOD AND SYSTEM FOR SELECTION OF METROLOGY TARGETS FOR USE IN FOCUS AND DOSE APPLICATIONS

(71) Applicant: KLA-Tencor Corporation, Milpitas, CA (US)

(72) Inventors: Roie Volkovich, Hadera (IL); Hiroyuki Kurita, Saitama (JP); Yoel Feler, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 952 days.

(21) Appl. No.: 14/270,991

(22) Filed: May 6, 2014

Related U.S. Application Data

(60) Provisional application No. 61/820,108, filed on May 6, 2013.

(51) Int. Cl.
*H01L 21/66* (2006.01)
(52) U.S. Cl.
CPC .................... *H01L 22/10* (2013.01)
(58) Field of Classification Search
CPC ........................................................ H01L 22/10
See application file for complete search history.

(56) References Cited

U.S. PATENT DOCUMENTS

| 2007/0050749 A1* | 3/2007 | Ye | G03F 1/44 430/30 |
| 2013/0135600 A1* | 5/2013 | Middlebrooks | G03F 7/70525 355/67 |

OTHER PUBLICATIONS

Wikipedia:Subset (<https://web.archive.org/web/20100317234548/https://en.wikipedia.org/wiki/Subset> retrieved by www.archive.org on Mar. 17, 2010).*
Wikipedia:Linear Discriminant Analysis (< https://web.archive.org/web/20121231200704/https://en.wikipedia.org/wiki/Linear_Discriminate_analysis> retrieved by www.archive.org on Dec. 31, 2012).*

* cited by examiner

*Primary Examiner* — Paul D Lee
*Assistant Examiner* — Mark I Crohn
(74) *Attorney, Agent, or Firm* — Suiter Swantz pc llo

(57) ABSTRACT

The selection of metrology targets for use in a focus and dose application includes providing a FEM wafer including a plurality of fields with one or more metrology targets, measuring the one or more metrology targets within each field of the FEM wafer, performing a regression process on measurement results from the one or more selected fields of the FEM wafer to determine one or more DOI values for the one or more metrology targets of the one or more selected fields, calculating one or more diagnostic parameters for the one or more metrology targets of the one or more selected fields based on the regression process performed on the one or more selected fields of the FEM wafer, and identifying a set of candidate metrology targets based on the one or more calculated diagnostic parameters of the one or more selected fields of the FEM wafer.

31 Claims, 4 Drawing Sheets

US 10,340,196 B1

METHOD AND SYSTEM FOR SELECTION OF METROLOGY TARGETS FOR USE IN FOCUS AND DOSE APPLICATIONS

CROSS-REFERENCE TO RELATED APPLICATION

The present application claims priority under 35 U.S.C. § 119(e) to U.S. Provisional Patent Application Ser. No. 61/820,108, filed May 6, 2013, entitled NOVEL TARGET SELECTION FOR FOCUS AND DOSE APPLICATION USING METROLOGY BASED SCATTEROMETRY MEASUREMENTS, naming Roie Volkovich, Hiroyuki Kurita and Yoel Feler as inventors, which is incorporated herein by reference in the entirety.

TECHNICAL FIELD

The present invention generally relates to focus and dose metrology, and, in particular, to the selection of metrology targets suitable for controlling and/or monitoring focus and dose.

BACKGROUND

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

As used throughout the present disclosure, the term "wafer" generally refers to substrates formed of a semiconductor or non-semiconductor material. For example, a semiconductor or non-semiconductor material may include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed. One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Metrology processes are used at various steps during a semiconductor manufacturing process to monitor process control during device fabrication. One such metrology process includes critical dimension (CD) metrology. CD metrology may be implemented utilizing a focus and exposure matrix (FEM) wafer.

Such approaches may include the use of test target structures having nominal parameters, such line width, sidewall angle and height. Scatterometry/ellipsometry based spectra may be collected from test targets for all combinations (if possible) of focus and exposure in a focus-expose matrix on a test wafer and stored in a library. Then, during measurement a closest match is found in the stored library for each spectrum and the corresponding structure parameters (e.g., line width, sidewall angle, line height, etc.) for the library matches are matched with the programmed focus and exposure combinations from the FEM test wafer.

As the dimensions of semiconductor devices decrease, CD metrology processes become even more important to the successful manufacture of acceptable semiconductor devices. As such, it would be advantageous to provide a system and method that provides improved CD metrology capabilities.

SUMMARY

A method of selecting metrology targets for use in a focus and dose application is disclosed. In one embodiment, the method may include, but is not limited to, providing a focus and exposure matrix wafer including a plurality of fields, each field including one or more metrology targets. In another embodiment, the method may include, but is not limited to, measuring the one or more metrology targets within each field of the focus and exposure matrix wafer. In another embodiment, the method may include, but is not limited to, performing a regression process on measurement results from the one or more selected fields of the focus and exposure matrix wafer to determine one or more dimension of interest (DOI) values for the one or more metrology targets of the one or more selected fields. In another embodiment, the method may include, but is not limited to, calculating one or more diagnostic parameters, such as focus sensitivity, library precision and printability, for the one or more metrology targets of the one or more selected fields based on the regression process performed on the one or more selected fields of the focus and dose exposure matrix wafer. In another embodiment, the method may include, but is not limited to, identifying a set of candidate metrology targets based on the one or more calculated diagnostic parameters of the one or more selected fields of the focus and exposure matrix wafer.

A system for selecting metrology targets for use in a focus and dose application is disclosed. In one embodiment, the system may include, but is not limited to, a metrology tool configured to measure one or more metrology targets within each field of a focus and exposure matrix wafer. In another embodiment, the system may include, but is not limited to, a controller communicatively coupled to the metrology tool, the controller including one or more processors configured to execute a set of program instructions. In one embodiment, the system may include, but is not limited to, program instructions configured to cause the one or more processors to receive one or more measurement results of the one or more metrology targets within each field of a focus and exposure matrix wafer from the controller. In another embodiment, the system may include, but is not limited to, program instructions configured to cause the one or more processors to perform a regression process on one or more selected fields of the focus and exposure matrix wafer with the one or more measurement results of the one or more metrology targets to determine the dimension of interest (DOI) values for the one or more metrology targets of the one or more selected fields. In another embodiment, the system may include, but is not limited to, program instructions configured to cause the one or more processors to calculate one or more diagnostic parameters for the one or more metrology targets of the one or more selected fields based on the regression process performed on the one or more selected fields of the focus and dose exposure matrix wafer. In another embodiment, the system may include, but is not limited to, program instructions configured to cause the one or more processors to identify a set of candidate metrology targets based on the one or more calculated diagnostic parameters of the one or more selected fields of the focus and dose exposure matrix wafer.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 1D, a method and system for selection of metrology targets for use in focus and dose applications are described in accordance with the present disclosure.

Embodiments of the present disclosure are directed to systems and methods for providing fast and efficient critical dimension target selection for focus and dose applications. Embodiments of the present invention may determine the dimension-of-interest of measured target structures through the implementation of a regression process. This is in contrast to the time-consuming process of determining DOI values and focus sensitivity using a library. Further, embodiments of the present invention do not require the time consuming process of CD-SEM to determine printability of one or more targets. Through the implementation of a regression process on metrology measurement results of target structures at selected field sites, along with calculating one or more diagnostic parameters based on the regression results, embodiments of the present invention provide a fast and efficient solution for target selection in focus and dose applications.

Figure 1A:
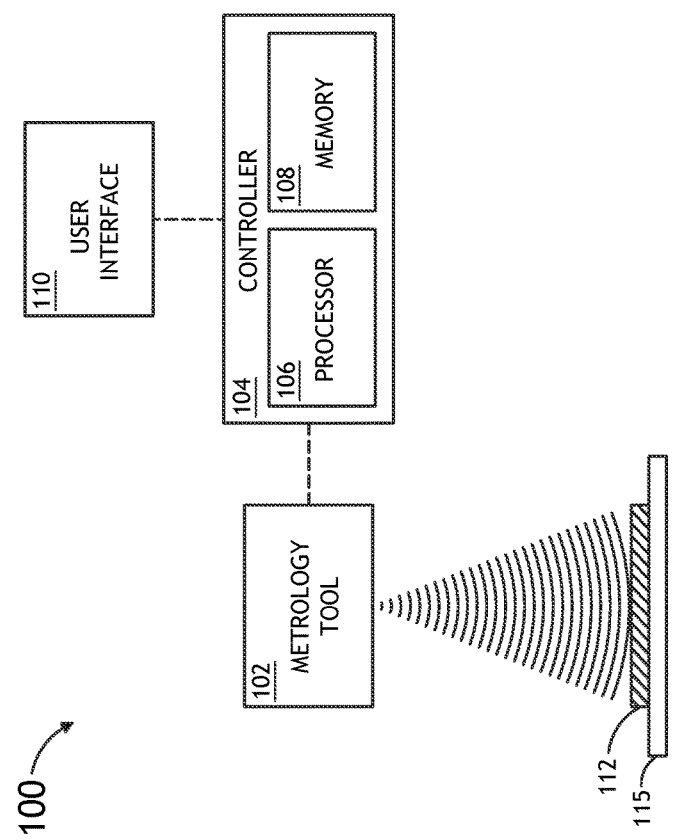
FIG. 1A is a block diagram view of a system for selecting metrology targets for use in a focus and dose application, in accordance with one embodiment of the present invention.

FIG. 1A illustrates a conceptual block diagram view of a system 100 for selection of metrology targets for use in focus and dose applications in accordance with one or more embodiments of the present disclosure. In one embodiment, the system 100 includes a metrology tool 102. In one embodiment, the metrology tool 102 is configured to measure one or more characteristics of one or more metrology targets within each field of a focus and exposure matrix (FEM) wafer. For example, the metrology tool 102 may measure one or more metrology targets in each field 114 of the FEM wafer 112, depicted in FIG. 1B. In one embodiment, the metrology tool 102 includes a CD metrology tool suitable for measuring one or more CD parameters from one or more CD targets disposed within each field of a FEM wafer. The CD metrology tool may be configured to measure any CD parameter known in the art. For example, the CD metrology tool may measure one or more of the following parameters from one or more CD targets: height, bottom CD, middle CD, top CD, bottom side wall angle, middle side wall angle and top side wall angle.

In one embodiment, the metrology tool 102 may include, but is not limited to, a scatterometer. In another embodiment, the metrology tool 102 may include, but is not limited to, an ellipsometer. In another embodiment, the metrology tool 102 may include, but is not limited to, a scanning electron microscope (SEM).

In another embodiment, the metrology tool 102 may be configured to measure one or more characteristics of the one or more metrology targets at different polarizations. For example, the metrology tool 102 may include, but is not limited to, an ellipsometer (e.g., equipped with polarizing/analyzing optical elements) configured to perform one or more metrology processes on the one or more metrology targets at a first polarization and at least a second polarization.

In one embodiment, the metrology tool 102 includes one or more illumination sources (not shown) to illuminate the FEM wafer 112. The illumination source may include any illumination source known in the art. For example, the illumination source may include a narrow band light source, such as a laser source. In another embodiment, the illumination source may be configured to direct light to the surface of the FEM wafer 112 (via various optical components) disposed on the sample stage 115. Further, the various optical components of the metrology tool 102 are configured to direct light reflected and/or scattered from the surface of the wafer 112 to a detector (not shown) of the metrology tool 102. The detector may include any appropriate detector known in the art. In one embodiment, the detector may include a charge coupled device (CCD) camera.

Applicants note that for purposes of simplicity the metrology tool 102 has been depicted in a simplified block diagram. This depiction, including the components and geometrical configuration, is not limiting and is provided for illustrative purposes only. It is recognized herein that the metrology tool 102 may include any number of optical elements, illumination sources and detectors to carry out the CD metrology process described herein, which may be based on known CD metrology techniques, such as scatterometry, ellipsometry, SEM and/or AFM techniques.

In another embodiment, the system 100 includes a controller 104. In one embodiment, the controller 104 is communicatively coupled to the metrology tool 102. For example, the controller 104 may be coupled to the output of a detector (not shown) of the metrology tool 102. The controller 104 may be coupled to the detector in any suitable manner (e.g., by one or more transmission media indicated by the line shown in FIG. 1A) such that the controller 104 can receive the output generated by the metrology tool 102.

In one embodiment, the controller 104 includes one or more processors 106. In one embodiment, the one or more processors 106 are configured to execute a set of program instructions. In another embodiment, the program instructions are configured to cause the one or more processors to receive the measurement results from the one or more metrology targets within each field of a focus and exposure matrix wafer. In another embodiment, the program instructions are configured to cause the one or more processors to perform a regression process on the one or more measurement results of the one or more selected fields of the focus and exposure matrix wafer to determine the dimension of interest (DOI) values for the one or more metrology targets of the one or more selected fields. In another embodiment, the program instructions are configured to cause the one or more processors to calculate one or more diagnostic parameters (e.g., focus sensitivity, library precision and/or printability) for the one or more metrology targets of the one or more selected fields based on the regression process performed on the one or more selected fields of the focus and dose exposure matrix wafer. In another embodiment, the program instructions are configured to cause the one or more processors to identify a set of candidate metrology targets based on the one or more calculated diagnostic parameters of the one or more selected fields of the focus and dose exposure matrix.

The one or more processors 106 of controller 104 may include any one or more processing elements known in the art. In this sense, the one or more processors 106 may include any microprocessor-type device configured to execute software algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 108. Moreover, different subsystems of the system 100 (e.g., metrology tool, display or user interface 110) may include processor or logic elements suitable for carrying out at least a portion of the steps described throughout the present disclosure. Therefore, the above description should not be interpreted as a limitation on the present invention but merely an illustration.

The memory medium 108 may include any storage medium known in the art suitable for storing program instructions executable by the associated one or more processors 106. For example, the memory medium 108 may include a non-transitory memory medium. For instance, the memory medium 108 may include, but is not limited to, a read-only memory, a random access memory, a magnetic or optical memory device (e.g., disk), a magnetic tape, a solid state drive and the like. In another embodiment, it is noted herein that the memory 108 is configured to store one or more results from the metrology tool 102 and/or the output of the various steps described herein. It is further noted that memory 108 may be housed in a common controller housing with the one or more processors 106. In an alternative embodiment, the memory 108 may be located remotely with respect to the physical location of the processors and controller 104. For instance, the one or more processors 106 of controller 104 may access a remote memory (e.g., server), accessible through a network (e.g., internet, intranet and the like). In another embodiment, the memory medium 108 includes program instructions for causing the one or more processors 106 to carry out the various steps described through the present disclosure.

In another embodiment, the controller 104 of the system 100 may be configured to receive and/or acquire data or information from other systems (e.g., inspection results from an inspection system or metrology results from a metrology system) by a transmission medium that may include wireline and/or wireless portions. In this manner, the transmission medium may serve as a data link between the controller 104 and other subsystems of the system 100. Moreover, the controller 104 may send data to external systems via a transmission medium (e.g., network connection).

In another embodiment, the system 100 includes a user interface 110. In one embodiment, the user interface 110 is communicatively coupled to the one or more processors 106 of controller 104. In another embodiment, the user interface device 110 may be utilized by controller 104 to accept selections and/or instructions from a user. In some embodiments, described further herein, a display may be used to display data to a user (not shown). In turn, a user may input selection and/or instructions (e.g., a user selection of measured field sites or field sites for regression process) responsive to data displayed to the user via the display device.

The user interface device 110 may include any user interface known in the art. For example, the user interface 110 may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user interface 110 may include, but is not limited to, a bezel mounted interface.

The display device (not shown) may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present invention.

Figure 1B:
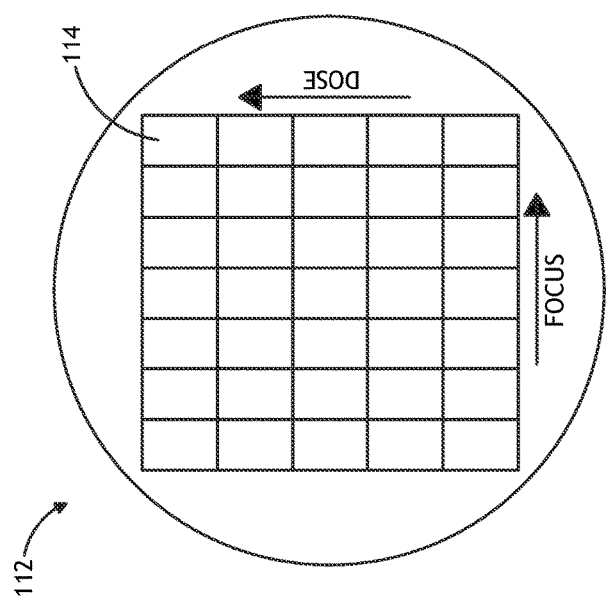
FIG. 1B is a top view of a focus and exposure matrix wafer, in accordance with one embodiment of the present invention.

The embodiments of the system 100 illustrated in FIGS. 1A-1B may be further configured as described herein. In addition, the system 100 may be configured to perform any other step(s) of any of the method embodiment(s) described herein.

Figure 1C:
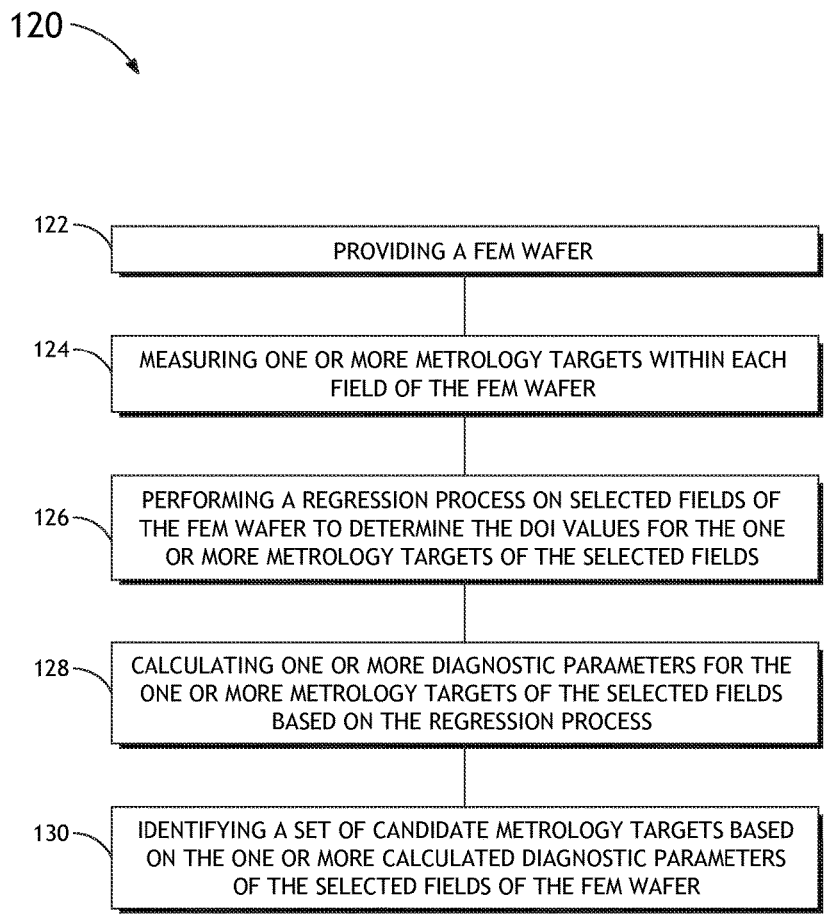
FIG. 1C is a flow diagram illustrating steps performed in a method of selecting metrology targets for use in a focus and dose application, in accordance with one embodiment of the present invention.

FIG. 1C is a flow diagram illustrating steps performed in a method 120 of selecting metrology targets for use in a focus and dose application, in accordance with one embodiment of the present invention. It is noted herein that the steps of method 120 may be implemented all or in part by the system 100. It is further recognized, however, that the method 120 is not limited to the system 100 in that additional or alternative system-level embodiments may carry out all or part of the steps of method 120.

In step 122, a focus-exposure matrix wafer including a plurality of fields is provided. In one embodiment, each field includes one or more metrology targets. In one embodiment, an FEM wafer, such as wafer 112 shown in 1B, may be printed with a variation of CD target structures (i.e., variation of CD parameters of targets) as a function of focus and dose. In another embodiment, the FEM wafer 112 may be printed with a variation of pitch in the target structures as a function of focus and dose. In addition, the FEM wafer 112 may be printed with a variation of CD parameters and pitch as a function of focus and dose across the wafer 112.

In step 124, the one or more metrology targets within each field of the focus and exposure matrix wafer are measured. In one embodiment, one or more characteristics of the one or more metrology targets within each field of the focus and exposure matrix wafer are measured. In one embodiment, the one or more metrology targets in each field 114 of the FEM wafer 112 are measured using metrology tool 102. The one or more metrology targets may be measured using any CD metrology tool known in the art. For example, the metrology tool 102 includes a CD metrology tool suitable for measuring one or more CD parameters from the one or more CD targets disposed within each field 114 of a FEM wafer 112. For instance, the CD metrology tool may be configured to measure one or more of the following parameters from one or more CD targets: height, bottom CD, middle CD, top CD, bottom side wall angle, middle side wall angle and top side wall angle.

In one embodiment, the one or more metrology targets may be measured by measuring the scattering and/or reflection of radiation from the one or more targets of the FEM wafer. In one embodiment, one or more characteristics of the metrology targets may be measured with a scatterometry-based metrology tool (e.g., scatterometer). In one embodiment, one or more characteristics of the metrology targets may be measured with an ellipsometer-based metrology tool (e.g., ellipsometer). In another embodiment, one or more characteristics of the metrology targets of the FEM wafer 112 may be measured as a function of polarization. In another embodiment, the one or more CD parameters of the FEM wafer 112 may be measured as a function of the wavelength of incident illumination on the FEM wafer 112. For example, the one or more metrology targets of the FEM wafer 112 may be measured with an ellipsometer equipped with polarizing/analyzing optical elements configured to perform one or more metrology processes on the one or more CD targets at a first polarization and at least a second polarization. By way of another example, the one or more metrology targets of the FEM wafer 112 may be measured with an ellipsometer or scatterometer configured to perform one or more metrology processes on the one or more CD targets as a function of incident wavelength and/or polarization.

In another embodiment, the one or more metrology targets may be measured with a scanning electron microscope (SEM). In another embodiment, the one or more metrology targets may be measured with an atomic force microscope (AFM).

In step 126, a regression process is performed on one or more selected fields of the focus-exposure matrix wafer to determine the dimension of interest (DOI) values for the one or more metrology targets of the one or more selected fields. In one embodiment, the regression process is performed on the measurement results from step 124 (i.e., measurement results from the one or more selected fields of the FEM wafer) to determine the DOI values for the one or more metrology targets of the one or more selected fields. The DOI calculated by the regression process may include any DOI known in the art of CD metrology. In one embodiment, the DOI may include a critical dimension of interest. For example, the dimension of interest may include, but is not limited to, at least one of height of the one or more CD targets, bottom CD of the one or more CD targets, middle CD of the one or more CD targets, top CD of the one or more CD targets, bottom side wall angle of the one or more CD targets, middle side wall angle of the one or more CD targets, top side wall angle of the one or more CD targets and pitch between two or more CD targets.

Figure 1D:
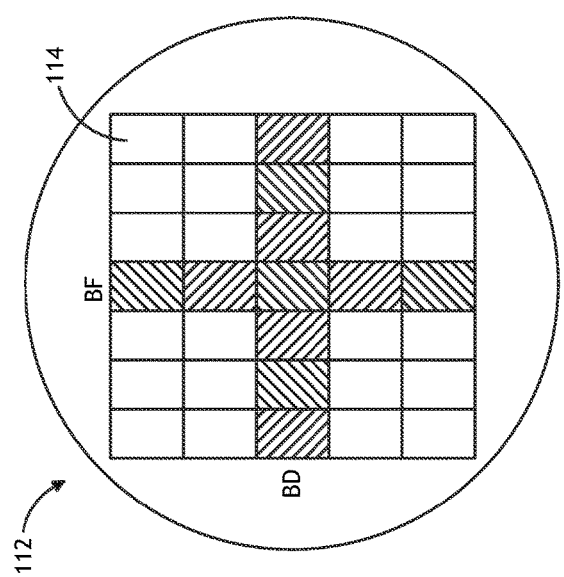
FIG. 1D is a top view of a focus and exposure matrix wafer with the best-dose and best-focus fields identified, in accordance with one embodiment of the present invention.

In one embodiment, the regression process may be carried out on additional sites across the FEM wafer 112 based on the results obtained from the one or more selected fields. As shown in FIG. 1D, a user may identify field sites that represent the "best dose (BD)" and/or the "best focus (BF)," represented as BD and BF in FIG. 1D respectively. In one embodiment, a regression process may be carried out across the target structures of field sites according to a regular FEM wafer. In another embodiment, a regression process may be carried out across the field sites (e.g., field sites of a random FEM wafer) corresponding to the target structures within the field sites identified by a user as either BD or BF. In another embodiment, only the target structures in the user-identified BD and BF fields may be measured via the metrology tool 102 prior to the regression process step 126. For example, a user may identify BD and BF fields via user interface 110.

In one embodiment, the regression process is carried out by the one or more processors 106 of controller 104 utilizing one or more profilometry processes. For example, the one or more regression processes may be carried out via optical digital profilometry software (e.g., ACUSHAPE).

In step 128, one or more diagnostic parameters are calculated for the one or more metrology targets of the one or more selected fields based on the regression process. In one embodiment, one or more diagnostic parameters are calculated for the one or more metrology targets of the one or more selected fields of the FEM wafer 112 based on the regression process of step 126. In one embodiment, the one or more diagnostic parameters include at least one of focus sensitivity, library precision and printability. In this regard, the one or more controllers 104 may calculate focus sensitivity, library precision and/or printability for the one or more metrology targets of the one or more selected fields 114 based on the regression process performed on the one or more selected fields of the FEM wafer 112. In another embodiment, each of the focus sensitivity, library precision and printability may be represented by a metric. For example, the focus sensitivity may be represented by a focus sensitivity metric. By way of another example, library precision may be represented by a library precision metric. By way of further example, the printability may be represented by a printability metric. In this regard, the focus sensitivity, library precision and printability may be represented by a metric calculated based on a user- or system-selected scoring procedure.

In one embodiment, the focus sensitivity of the one or more metrology targets of the one or more selected fields 114 is calculated via a slope of the side wall angle (SWA) acquired during the performed regression process by controller 104. For example, a focus sensitivity metric may be generated by the controller 104 for the one or more metrology targets of the one or more selected fields 114 using the slope of the side wall angle (SWA) acquired during the performed regression process.

In another embodiment, the library precision of the one or more metrology targets of the one or more selected fields 114 is calculated via a parameter sensitivity (e.g., DOI sensitivity) and noise model associated with the one or more metrology targets by controller 104 (e.g., using ACUSHAPE). For example, a library precision metric may be generated by controller 104 for the one or more metrology targets of the one or more selected fields 114 via a parameter sensitivity and noise model associated with the one or more metrology targets (e.g., using ACUSHAPE). In one embodiment, the library precision/library precision metric may be calculated based on the stack model. In one embodiment, the library precision/library precision metric may be calculated utilizing a rigorous coupled wave analysis (RCWA) engine. It is noted herein that the library precision (and the library precision metric) is indicative of the library quality that may eventually be generated for the given metrology target candidates. In one embodiment, the library precision/library precision metric may be calculated manually. In one embodiment, the library precision/library precision metric may be calculated automatically by controller 104.

In another embodiment, the printability of the one or more metrology targets of the one or more selected fields 114 is calculated by analyzing the physical geometry of the one or metrology targets and assigning a feasibility score to the analyzed physical geometry. For example, a printability metric may be generated by controller 104 for the one or more metrology targets of the one or more selected fields 114 by analyzing the physical geometry of the one or metrology targets and assigning a feasibility score to the analyzed physical geometry. In one embodiment, the printability/printability precision metric may be calculated utilizing a rigorous coupled wave analysis (RCWA) engine.

In one embodiment, the printability/printability metric may be calculated for each field and is indicative of whether implemented model used to determine a DOI is physical (e.g., large changes in measured DOI values may suggest an unphysical model). In one embodiment, the printability/printability metric may be calculated by the controller 104 by analyzing the physical geometry of the one or more metrology targets based on the results of the regression process of DOI of one or more targets of the selected sites in step 126. For example, the printability/printability metric may be calculated by the controller 104 by analyzing the physical geometry of a stack based on the results of the regression process of DOI of one or more targets of the selected sites.

For example, the feasibility score may consist of a qualitative score, whereby the feasibility score indicates whether the printing of a given target is "feasible" or "forbidden." For instance, a given target may receive a forbidden score if the geometry computed by the controller 104 leads to an unphysical result. In another embodiment, a field that receives a forbidden score may cause the controller 104 to eliminate the given examined target from the final target candidate list. In one embodiment, the printability precision/printability metric may be calculated manually. In one embodiment, the printability precision/printability metric may be calculated automatically by controller 104.

It is recognized herein that the one or more diagnostic parameters calculated in step 128 may be calculated using on-tool or off-tool processing capabilities. As such, in one embodiment, controller 104 may be integrated within the metrology tool 102. In another embodiment, the controller 104 may be located external and separate to the metrology tool 102.

In step 130, a set of candidate metrology targets based on the one or more calculated diagnostic parameters of the one or more selected fields of the FEM wafer 112 is identified. In one embodiment, the set of candidate metrology targets may be identified by controller 104 by applying a weighting procedure to two or more calculated diagnostic parameters of the one or more selected fields of the FEM wafer 112. In one embodiment, the controller 104 may assign a focus sensitivity weighting factor, a library precision weighting factor and a printability weighting factor to the results received in step 128. In another embodiment, the weighting factors may be user selectable. In another embodiment, the weighting factors may be automatically assigned by controller 104 based on previous results obtained by the system.

In another embodiment, the controller 104 may apply each of the weighting factors to their respective contributing metrics (found in step 128) in order to identify one or more candidate targets. In this regard, the level of contribution each contributing metric (e.g., focus sensitivity, library precision, and printability) has on the identification of one or more candidate targets may be adjusted by a user or the controller 104. In this regard, the best (or at least satisfactory) candidate targets, with respect to the focus sensitivity, library precision and printability, may be identified.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A method of selecting metrology targets for use in a focus and dose application comprising:
   providing a focus and exposure matrix wafer including a plurality of fields, each field including one or more metrology targets to a metrology tool;
   measuring the one or more metrology targets within each of the plurality of fields of the focus and exposure matrix wafer with one or more detectors of the metrology tool to obtain one or more measurement results;
   providing the one or more measurement results to a controller including one or more processors, wherein the one or more processors are communicatively coupled to the one or more detectors;
   selecting a subset of fields of the plurality of fields of the focus and exposure matrix wafer with the one or more processors, wherein the subset of fields includes a number of fields less than the entirety of the plurality of fields;
   performing a regression process on the one or more measurement results of the one or more metrology targets in the selected subset of fields of the plurality of fields of the focus and exposure matrix wafer to determine one or more dimension of interest (DOI) values for the one or more metrology targets in the selected subset of fields of the plurality of fields with the one or more processors;
   calculating a focus sensitivity, a library precision, and a printability for the one or more metrology targets in the selected subset of fields of the plurality of fields based on the regression process performed on the selected subset of fields of the plurality of fields of the focus and dose exposure matrix wafer with the one or more processors, wherein the library precision is determined via a parameter sensitivity and noise model for the one or more metrology targets;
   identifying a set of candidate metrology targets based on the focus sensitivity, the library precision, and the printability calculated for the one or more metrology targets in the selected subset of fields of the plurality of fields of the focus and exposure matrix wafer with the one or more processors, wherein the library precision defines a quality level of a library able to be generated from the set of candidate metrology targets; and
   configuring one or more semiconductor device process tools to reduce selection time of a target for at least one of controlling or monitoring focus and dose, wherein the one or more semiconductor device process tools are configured based on the set of target candidates.

2. The method of claim 1, wherein the measuring one or more metrology targets of each field of a focus and exposure matrix wafer comprises:

measuring one or more metrology targets of each field of a focus and exposure matrix wafer at two or more polarizations.

3. The method of claim 1, wherein the measuring one or more metrology targets of each field of a focus and exposure matrix wafer comprises:
 measuring one or more metrology targets of each field of a focus and exposure matrix wafer with at least one of an ellipsometer or a scatterometer.

4. The method of claim 1, wherein the measuring one or more metrology targets of each field of a focus and exposure matrix wafer comprises:
 measuring of one or more metrology targets of each field of a focus and exposure matrix wafer with a scanning electron microscope.

5. The method of claim 1, wherein the measuring one or more metrology targets of each field of a focus and exposure matrix wafer comprises:
 measuring one or more metrology targets of each field of a focus and exposure matrix wafer with illumination from one or more illumination sources.

6. The method of claim 1, wherein the measuring one or more metrology targets of each field of a focus and exposure matrix wafer with illumination from one or more illumination sources comprises:
 measuring one or more metrology targets of each field of a focus and exposure matrix wafer with illumination from one or more laser sources.

7. The method of claim 1, wherein the performing a regression process on the one or more measurement results of the one or more metrology targets in the selected subset of fields of the plurality of fields of the focus and exposure matrix wafer to determine one or more dimension of interest (DOI) values for the one or more metrology targets in the selected subset of fields of the plurality of fields comprises:
 performing a regression process on the one or more measurement results of the one or more metrology targets in the selected subset of fields of the plurality of fields of the focus and exposure matrix wafer to determine one or more critical dimension of interest values of one or more critical dimension (CD) targets in the selected subset of fields of the plurality of fields of the focus and exposure matrix wafer.

8. The method of claim 7, wherein the critical dimension of interest of one or more CD targets comprises:
 at least one of height of the one or more CD targets, bottom CD of the one or more CD targets, middle CD of the one or more CD targets, top CD of the one or more CD targets, bottom side wall angle of the one or more CD targets, middle side wall angle of the one or more CD targets, top side wall angle of the one or more CD targets and pitch between two or more CD targets.

9. The method of claim 1, wherein the performing a regression process on the one or more measurement results of the one or more metrology targets in the selected subset of fields of the plurality of fields of the focus and exposure matrix wafer to determine one or more dimension of interest (DOI) values for the one or more metrology targets in the selected subset of fields of the plurality of fields comprises:
 performing a regression process on the one or more measurement results of the one or more metrology targets in the selected subset of fields of the plurality of fields of the focus and exposure matrix wafer with one or more profilometry processes.

10. The method of claim 1, wherein the calculating the focus sensitivity, the library precision, and the printability for the one or more metrology targets in the selected subset of fields of the plurality of fields based on the regression process performed on the selected subset of fields of the plurality of fields of the focus and dose exposure matrix wafer comprises:
 calculating a focus sensitivity metric, a library precision metric, and a printability metric for the one or more metrology targets in the selected subset of fields of the plurality of fields based on the regression process performed on the selected subset of fields of the plurality of fields of the focus and dose exposure matrix wafer.

11. The method of claim 10, wherein the focus sensitivity metric of the one or more metrology targets in the selected subset of fields of the plurality of fields is calculated via a slope of the side wall angle acquired during the performed regression process.

12. The method of claim 10, wherein the printability metric of the one or more metrology targets in the selected subset of fields of the plurality of fields is calculated by analyzing the physical geometry of the one or metrology targets and assigning a feasibility score to the analyzed physical geometry.

13. The method of claim 1, wherein at least some of the focus sensitivity, the library precision, and the printability include one or more weighting factors, wherein the one or more weighting factors of the at least some of the focus sensitivity, the library precision, and the printability are independently adjustable.

14. The method of claim 13, wherein the one or more weighting factors of the at least some of the focus sensitivity, the library precision, and the printability are independently adjustable by a user via the controller.

15. The method of claim 13, wherein the one or more weighting factors of the at least some of the focus sensitivity, the library precision, and the printability are independently adjustable via a controller-operated assignment process based on one or more previously-identified sets of candidate metrology targets.

16. The method in claim 1, further comprising:
 selecting at least a second subset of fields of the plurality of fields of the focus and exposure matrix wafer based on the performed regression process;
 performing at least a second regression process on at least a second set of one or more measurement results of the one or more metrology targets in the at least a second selected subset of fields of the plurality of fields of the focus and exposure matrix wafer to determine one or more dimension of interest (DOI) values for the one or more metrology targets in the selected at least a second subset of fields of the plurality of fields, wherein the at least a second selected subset of fields of the plurality of fields include one or more fields not included in the selected subset of fields of the plurality of fields;
 calculating a focus sensitivity, a library precision, and a printability for the one or more metrology targets in the selected at least a second subset of fields of the plurality of fields based on the regression processes performed on the selected at least a second subset of fields of the plurality of fields of the focus and dose exposure matrix wafer.

17. A system for selecting metrology targets for use in a focus and dose application comprising:
 a metrology tool including one or more detectors configured to measure one or more metrology targets within each of the plurality of fields of a focus and exposure matrix wafer; and a controller communicatively coupled to the one or more detectors of the metrology tool, the controller including one or more processors configured to execute a set of program instructions, the program instructions configured to cause the one or more processors to:
receive one or more measurement results of the one or more metrology targets within each of the plurality of fields of a focus and exposure matrix wafer from the metrology tool;
select a subset of fields of the plurality of fields of the focus and exposure matrix wafer;
perform a regression process on the one or more measurement results of the one or more metrology targets in the selected subset of fields of the plurality of fields of the focus and exposure matrix wafer with the one or more measurement results of the one or more metrology targets to determine the dimension of interest (DOI) values for the one or more metrology targets in the selected subset of fields of the plurality of fields;
calculate a focus sensitivity, a library precision, and a printability for the one or more metrology targets in the selected subset of fields of the plurality of fields based on the regression process performed on the selected subset of fields of the plurality of fields of the focus and dose exposure matrix wafer, wherein the library precision is determined via a parameter sensitivity and noise model for the one or more metrology targets;
identify a set of candidate metrology targets based on the focus sensitivity, the library precision, and the printability calculated for the one or more metrology targets in the selected subset of fields of the plurality of fields of the focus and dose exposure matrix wafer, wherein the library precision defines a quality level of a library able to be generated from the set of candidate metrology targets; and
configure one or more semiconductor device process tools to reduce selection time of a target for at least one of controlling or monitoring focus and dose, wherein the one or more semiconductor device process tools are configured based on the set of target candidates.

18. The system of claim 17, wherein the metrology tool comprises:
at least one of an ellipsometer and a scatterometer.

19. The system of claim 17, wherein the metrology tool comprises:
a scanning electron microscope.

20. The system of claim 17, wherein the metrology tool includes one or more illumination sources.

21. The system of claim 20, wherein the one or more illumination sources comprises:
one or more laser sources.

22. The system of claim 17, wherein the controller is further configured to perform a regression process on the one or more measurement results of the one or more metrology targets in the selected subset of fields of the plurality of fields of the focus and exposure matrix wafer to determine one or more critical dimension of interest values of one or more critical dimension (CD) targets in the selected subset of fields of the plurality of fields of the focus and exposure matrix wafer.

23. The system of claim 22, wherein the critical dimension of interest of one or CD targets comprises:
at least one of height of the one or more CD targets, bottom CD of the one or more CD targets, middle CD of the one or more CD targets, top CD of the one or more CD targets, bottom side wall angle of the one or more CD targets, middle side wall angle of the one or more CD targets, top side wall angle of the one or more CD targets and pitch between two or more CD targets.

24. The system of claim 17, wherein the controller is further configured to perform a regression process on the one or more measurement results of the one or more metrology targets in the selected subset of fields of the plurality of fields of the focus and exposure matrix wafer with one or more profilometry processes.

25. The system of claim 17, wherein the controller is further configured to calculate a focus sensitivity metric, a library precision metric, and a printability metric for the one or more metrology targets in the selected subset of fields of the plurality of fields based on the regression process performed on the selected subset of fields of the plurality of fields of the focus and dose exposure matrix wafer.

26. The system of claim 25, wherein the focus sensitivity metric of the one or more metrology targets in the selected subset of fields of the plurality of fields is calculated via a slope of the side wall angle acquired during the performed regression process.

27. The system of claim 25, wherein the printability metric of the one or more metrology targets in the selected subset of fields of the plurality of fields is calculated by analyzing the physical geometry of the one or metrology targets and assigning a feasibility score to the analyzed physical geometry.

28. The system of claim 17, wherein at least some of the focus sensitivity, the library precision, and the printability include one or more weighting factors, wherein the one or more weighting factors of the at least some of the focus sensitivity, the library precision, and the printability are independently adjustable.

29. The system of claim 28, wherein the controller is further configured to independently adjust the one or more weighting factors of the at least some of the focus sensitivity, the library precision, and the printability based on one or more inputted user selections.

30. The system of claim 28, wherein the controller is further configured to individually adjust the at least some of the focus sensitivity, the library precision, and the printability based on one or more previously-identified sets of candidate metrology targets.

31. The system in claim 17, wherein the controller is further configured to:
select at least a second subset of fields of the plurality of fields of the focus and exposure matrix wafer based on the performed regression process;
perform at least a second regression process on at least a second set of one or more measurement results of the one or more metrology targets in the at least a second selected subset of fields of the plurality of fields of the focus and exposure matrix wafer to determine one or more dimension of interest (DOI) values for the one or more metrology targets in the selected at least a second subset of fields of the plurality of fields, wherein the at least a second selected subset of fields of the plurality of fields include one or fields not included in the selected subset of fields of the plurality of fields; and
calculate a focus sensitivity, a library precision, and a printability for the one or more metrology targets in the selected at least a second subset of fields of the plurality of fields based on the regression processes performed on the selected at least a second subset of fields of the plurality of fields of the focus and dose exposure matrix wafer.

* * * * *